United States Patent
Hamers et al.

(10) Patent No.: US 10,274,530 B2
(45) Date of Patent: Apr. 30, 2019

(54) SYSTEM AND METHOD FOR DYNAMIC GROUND FAULT DETECTION

(71) Applicant: Honeywell International Inc., Morristown, NJ (US)

(72) Inventors: Adrianus Cornelis Maria Hamers, Berkel-Enschot (NL); Erik Wormmeester, Best (NL)

(73) Assignee: Honeywell International Inc., Morris Plains, NJ (US)

( * ) Notice: Subject to any disclaimer, the term of this patent is extended or adjusted under 35 U.S.C. 154(b) by 313 days.

(21) Appl. No.: 14/805,973

(22) Filed: Jul. 22, 2015

(65) Prior Publication Data

US 2017/0023631 A1    Jan. 26, 2017

(51) Int. Cl.
| | |
|---|---|
| *G01R 27/18* | (2006.01) |
| *G01R 31/02* | (2006.01) |
| *G01R 31/40* | (2014.01) |
| *H02H 3/16* | (2006.01) |

(52) U.S. Cl.
CPC .......... *G01R 31/025* (2013.01); *G01R 31/40* (2013.01); *H02H 3/16* (2013.01)

(58) Field of Classification Search
None
See application file for complete search history.

(56) References Cited

U.S. PATENT DOCUMENTS

| | | | | |
|---|---|---|---|---|
| 4,992,723 A | * | 2/1991 | Zylstra | H02H 1/066 |
| | | | | 323/324 |
| 5,933,077 A | * | 8/1999 | Vogt | G08B 29/06 |
| | | | | 340/3.43 |
| 7,613,974 B2 | | 11/2009 | Meagher | |
| 8,045,303 B2 | | 10/2011 | Curl et al. | |
| 8,319,466 B2 | | 11/2012 | Valdez et al. | |
| 2008/0238344 A1 | * | 10/2008 | Isobe | B60Q 11/00 |
| | | | | 315/312 |
| 2014/0340797 A1 | | 11/2014 | Ahladas et al. | |

FOREIGN PATENT DOCUMENTS

EP    2706518    3/2014

* cited by examiner

*Primary Examiner* — Melissa J Koval
*Assistant Examiner* — Courtney G McDonnough (57) ABSTRACT

A ground fault detector includes a relay configured to receive a first current. The ground fault detector also includes a voltage regulator configured to provide a voltage potential to ground. The ground fault detector further includes an amplifier configured, in response to a ground current flowing into or out of the ground fault detector, to change an output voltage of the amplifier in order to cause a change in the first current received at the relay. The change in the first current is indicative of a ground fault. Upon detection of a ground fault, the ground fault detector can be isolated from ground.

20 Claims, 4 Drawing Sheets

SYSTEM AND METHOD FOR DYNAMIC GROUND FAULT DETECTION

TECHNICAL FIELD

This disclosure relates generally to industrial process control and automation systems. More specifically, this disclosure relates to a system and method for dynamic ground fault detection, such as in an industrial process control and automation system.

BACKGROUND

Industrial process control and automation systems, including direct current (DC) powered control systems, are often used to automate large and complex industrial processes. These types of systems routinely include sensors, actuators, and controllers. The controllers typically receive measurements from the sensors and generate control signals for the actuators.

A ground fault in a DC-powered control system that is connected to many field devices installed over long distances from a controller can affect statuses read from input field devices and can affect statuses of output field devices. This effect is independent of the ground fault detection principle used. Standards and customer requirements often dictate that ground faults should be detected but should have no effect on the state of a process under control. Existing ground fault detection solutions often permanently affect the state of the process under control or are not capable of correlating input state changes with ground faults being detected.

SUMMARY

This disclosure provides a system and method for dynamic ground fault detection.

In a first embodiment, a ground fault detector includes a relay or equivalent component configured to receive a first current. The ground fault detector also includes a voltage regulator configured to provide a voltage potential to ground. The ground fault detector further includes an amplifier configured, in response to a ground current flowing into or out of the ground fault detector, to change an output voltage of the amplifier in order to cause a change in the first current received at the relay. The change in the first current is indicative of a ground fault.

In a second embodiment, a method includes receiving a first current at a ground fault detector. The method also includes providing, by the ground fault detector, a voltage potential to ground. The method further includes, in response to a ground current flowing into or out of the ground fault detector, changing an output voltage of an amplifier in the ground fault detector. The change in the output voltage of the amplifier causes a change in the first current received at the ground fault detector. The change in the first current is indicative of a ground fault.

In a third embodiment, a system includes a controller and a ground fault detector electrically coupled to the controller. The ground fault detector includes a relay configured to receive a first current from the controller. The ground fault detector also includes a voltage regulator configured to provide a voltage potential to ground. The ground fault detector further includes an amplifier configured, in response to a ground current flowing into or out of the ground fault detector, to change an output voltage of the amplifier in order to cause a change in the first current received at the relay. The controller is configured to detect the change in the first current as an indication of a ground fault.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

FIGS. 1 through 4, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Ground fault detection systems are often employed on 24 VDC powered control systems or other DC control systems in order to monitor ground faults that may occur. Some existing ground fault detection solutions measure a resistance, voltage, or to current between ground and a common terminal of a power supply. When a ground fault occurs, the resistance, voltage, or current changes and an alarm is generated or an action is taken, such as switching off the power supply. However, in some critical control systems (such as fire and gas detection systems), it is often desired or required that the control system functionality remain available, even in the event of a ground fault. Furthermore, in the case of a fire and gas detection system, the occurrence of a ground fault should not result in a false fire or gas detection alarm.

To address these issues, embodiments of this disclosure provide a ground fault detector configured to (1) detect ground faults, (2) correlate a ground fault detection with input state changes and output switch behavior changes, and (3) be disconnected from ground to remove its influence on the affected I/O channel. Such features may be used in conjunction with a wide variety of control systems, including fire and gas detection systems with high quantities of non-isolated I/O channels. However, this disclosure is not limited to fire and gas detection systems, and the principles disclosed here are applicable to other environments and industries.

Figure 1:
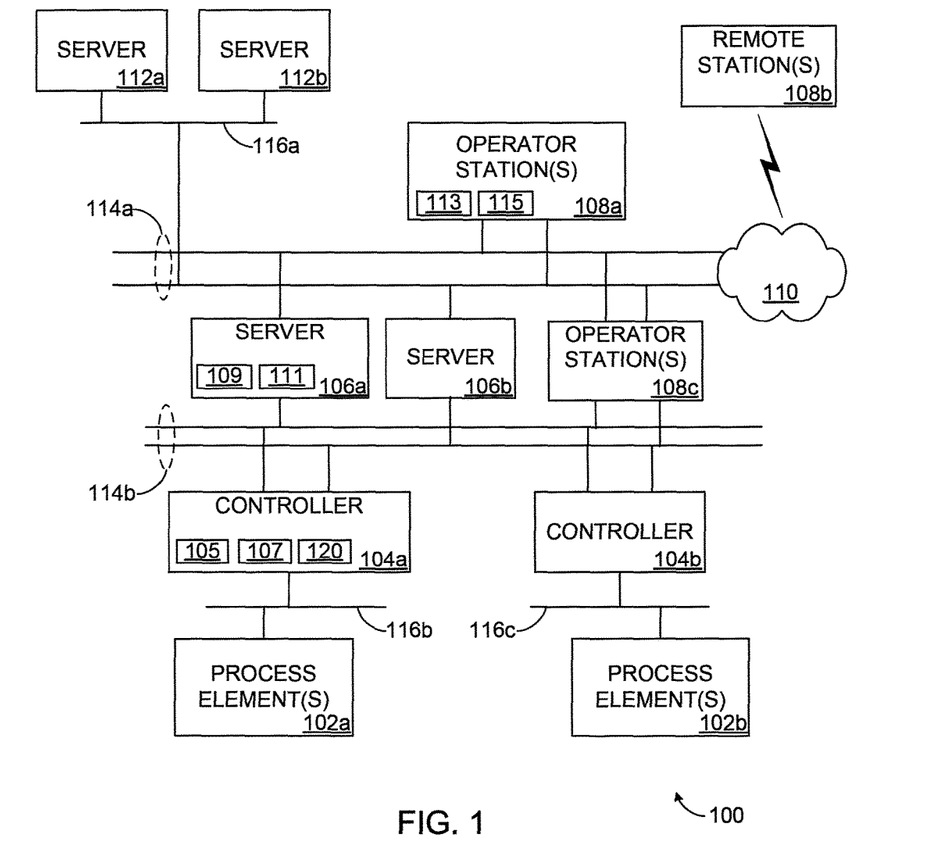
FIG. 1 illustrates an example industrial process control and automation system according to this disclosure.

FIG. 1 illustrates an example industrial process control and automation system 100 according to this disclosure. As shown in FIG. 1, the system 100 includes one or more process elements 102a-102b. The process elements 102a-102b represent components in a process or production system that may perform any of a wide variety of functions. For example, the process elements 102a-102b could represent sensors or equipment in a fire or gas detection and prevention system. In other embodiments, the process elements 102a-102b could represent equipment used to manufacture chemical, pharmaceutical, paper, or petrochemical products. Each of the process elements 102a-102b includes any suitable structure for performing one or more functions in a process or production system, such as a sensor or actuator.

Two controllers 104a-104b are coupled to the process elements 102a-102b. The controllers 104a-104b control the operation of the process elements 102a-102b. For example, the controllers 104a-104b could receive measurements from sensors and generate control signals for actuators in order to control the operation of a fire or gas detection and prevention system. Each controller 104a-104b includes any suitable structure for controlling one or more of the process elements 102a-102b.

Two servers 106a-106b are coupled to the controllers 104a-104b. The servers 106a-106b perform various functions to support the operation and control of the controllers 104a-104b and the process elements 102a-102b. For example, the servers 106a-106b could log information collected or generated by the controllers 104a-104b, such as status information related to the operation of the process elements 102a-102b. The servers 106a-106b could also execute applications that control the operation of the controllers 104a-104b, thereby controlling the operation of the process elements 102a-102b. In addition, the servers 106a-106b could provide secure access to the controllers 104a-104b. Each of the servers 106a-106b includes any suitable structure for providing access to or control of the controllers 104a-104b, such as one or more processors 109 and one or more memories 111.

One or more operator stations 108a-108b are coupled to the servers 106a-106b, and one or more operator stations 108c are coupled to the controllers 104a-104b. The operator stations 108a-108b represent computing or communication devices providing user access to the servers 106a-106b, which could then provide user access to the controllers 104a-104b and the process elements 102a-102b. The operator stations 108c represent computing or communication devices providing direct user access to the controllers 104a-104b. As particular examples, the operator stations 108a-108c could allow users to review the operational history of the process elements 102a-102b using information collected by the controllers 104a-104b and/or the servers 106a-106b. The operator stations 108a-108c could also allow the users to adjust the operation of the process elements 102a-102b, controllers 104a-104b, or servers 106a-106b. Each of the operator stations 108a-108c includes any suitable structure for supporting user access and control of the system 100, such as one or more processors 113 and one or more memories 115.

In this example, at least one of the operator stations 108b is remote from the servers 106a-106b. The remote station is coupled to the servers 106a-106b through a network 110. The network 110 facilitates communication between various components in the system 100. For example, the network 110 may communicate Internet Protocol (IP) packets, frame relay frames, Asynchronous Transfer Mode (ATM) cells, or other information between network addresses. The network 110 may include one or more local area networks (LANs), metropolitan area networks (MANs), wide area networks (WANs), all or a portion of a global network such as the Internet, or any other communication system or systems at one or more locations.

In this example, the system 100 includes two additional servers 112a-112b. The servers 112a-112b execute various applications to control the overall operation of the system 100. For example, the system 100 could be a fire or gas detection and prevention system, and the servers 112a-112b could execute applications used to control the fire or gas detection and prevention system. In some embodiments, the servers 112a-112b could execute applications such as enterprise resource planning (ERP), manufacturing execution system (MES), or any other or additional plant or process control applications. Each of the servers 112a-112b includes any suitable structure for controlling the overall operation of the system 100.

In some embodiments, each of the controllers 104a-104b includes one or more processing devices 105, such as one or more microprocessors, microcontrollers, digital signals processors, field programmable gate arrays, application specific integrated circuits, or discrete logic devices. Each of the controllers 104a-104b also includes one or more memories 107 storing instructions and data used, collected, or generated by the processing device(s) 105, such as a random access memory or a Flash or other read-only memory. In addition, each of the controllers 104a-104b includes one or more interfaces 120 facilitating communication with the process elements 102a-102b. In particular embodiments, each of the controllers 104a-104b includes a number of analog inputs, analog outputs, digital inputs, or digital outputs, or a combination of these.

As shown in FIG. 1, the system 100 includes various redundant networks 114a-114b and single networks 116a-116c that support communication between components in the system 100. Each of these networks 114a-114b, 116a-116c represents any network or combination of networks facilitating communication between components in the system 100. The networks 114a-114b, 116a-116c could, for example, represent Ethernet networks.

In accordance with this disclosure, various components of the system 100 support a process for ground fault detection in the system 100. For example, the controllers 104a-104b may represent field device controllers, and the process element 102a-102b may represent field devices. The field device controllers can each include or be used in conjunction with a ground fault detector. Each ground fault detector may be configured for detection of a ground fault that occurs somewhere within the system 100. Additional details regarding this functionality are provided below.

Although FIG. 1 illustrates one example of an industrial process control and automation system 100, various changes may be made to FIG. 1. For example, an industrial process control and automation system could include any number of process elements, controllers, servers, operator stations, and networks. Also, the makeup and arrangement of the system 100 is for illustration only. Components could be added, omitted, combined, or placed in any other configuration according to particular needs. Further, while described as being used to produce or process certain types of products, the system 100 could be used in any other manner. In addition, FIG. 1 illustrates one example operational environment where a ground fault detector could be used. One or more ground fault detectors could be used in any other suitable systems.

Figure 2:
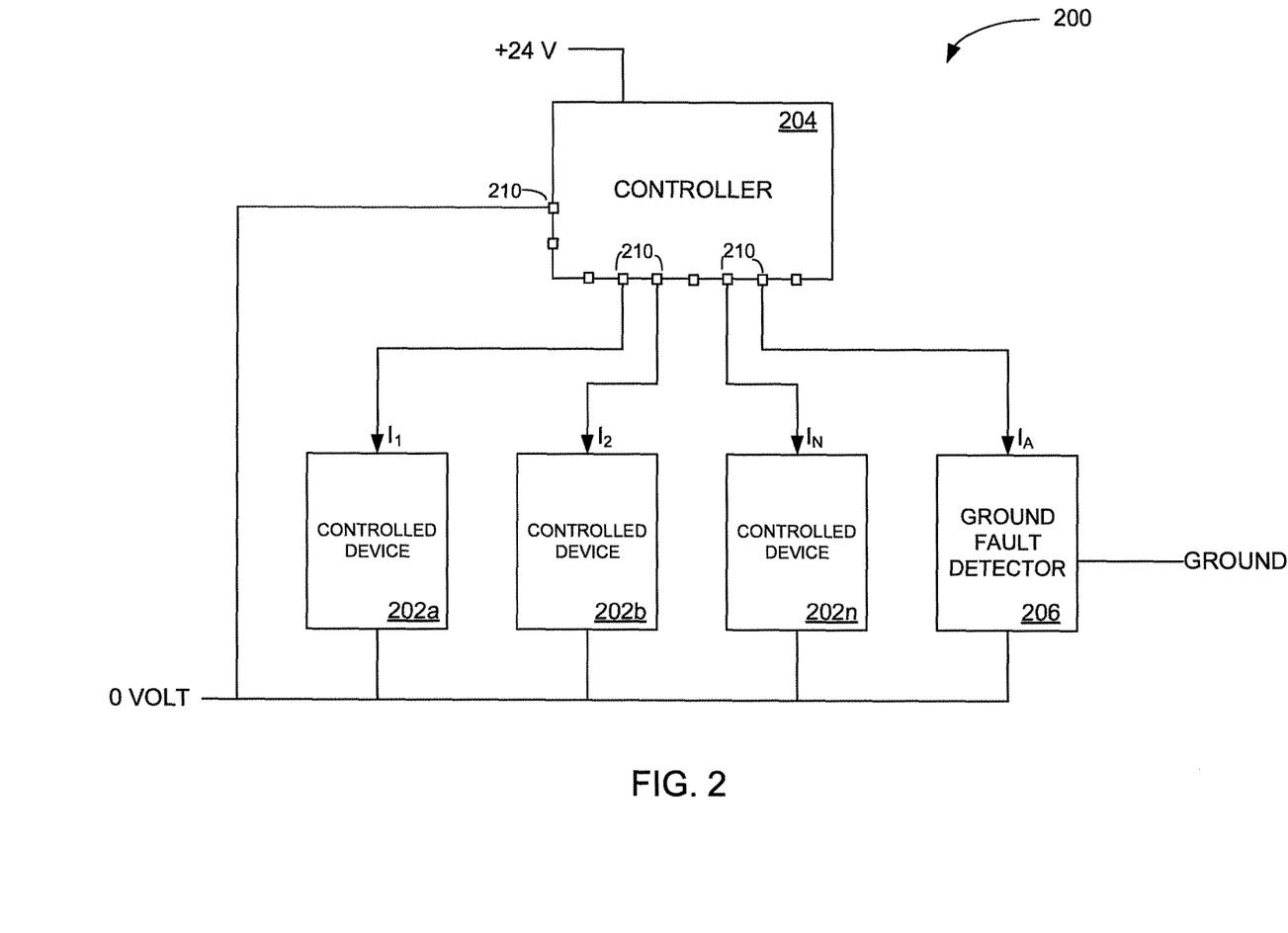
FIG. 2 illustrates example portions of an industrial process control and automation system that includes a ground fault detector according to this disclosure.

FIG. 2 illustrates example portions of an industrial process control and automation system 200 that includes a ground fault detector according to this disclosure. The system 200 may represent (or be represented by) the industrial process control and automation system 100 of FIG. 1. In particular embodiments, the system 200 could represent a fire or gas detection and prevention system. However, the system 200 could be used in any other suitable manner.

As shown in FIG. 2, the system 200 includes one or more controlled devices 202a-202n, a controller 204, and a ground fault detector 206. In some embodiments, the controller 204 could represent the controller 104a or 104b in FIG. 1, and the controlled devices 202a-202n could represent the process elements 102a or 102b in FIG. 1.

The controller 204 controls operation of the controlled devices 202a-202n and the ground fault detector 206. The controller 204 includes a number of inputs and outputs 210. In some embodiments, the controller 204 may include hundreds of inputs and outputs 210, including one or more analog inputs, analog outputs, digital inputs, digital outputs, or a combination of these. Of course, more or fewer inputs and outputs 210 could be used.

The controlled devices 202a-202n include a number of field devices, such as one or more sensors, solenoids, and switches. Each of the controlled devices 202a-202n and the ground fault detector 206 can operate on an independent channel controlled by the controller 204. Each channel is coupled to the controller 204 at one or more of the inputs or outputs 210. Each channel includes at least one wire connected to the controller 204 and extending to the associated field device. The controller 204 supplies power to each of the controlled devices 202a-202n through one of the wires, resulting in a load current $I_1$-$I_N$ that is determined by each controlled device 202a-202n. Thus, each controlled device 202a-202n has the potential to have a ground fault, either internally or along one of the connecting wires.

The ground fault detector 206 is connected to one of the analog inputs 210 of the controller 204. The controller 204 supplies power to the ground fault detector 206 through one or more wires connected to the analog input 210, resulting in a current $I_A$ to an input of the ground fault detector 206. The ground fault detector 206 generates a voltage potential with ground. The controller 204 may be configured to measure the current $I_A$ being drawn by the ground fault detector 206. Additionally or alternatively, the controller 204 may be configured to measure a voltage difference from ground due to a change in the current $I_A$ drawn by the ground fault detector 206.

In one aspect of operation, a ground fault may occur somewhere in the system 200, such as in one of the wires between any of the controlled devices 202a-202n and the controller 204 or in the electric or electronic components internal to each controlled device 202a-202n. Only the ground fault detector 206 is connected to ground, and the rest of the system 200 is isolated from ground. Thus, when a ground fault occurs elsewhere in the system 200 (such as when a wire connected to one of the controlled devices 202a-202n is cut, thus exposing the wire to ground), the voltage potential with ground at the ground fault detector 206 causes current to flow between ground and the ground fault detector 206. Due to the structure and operation of the ground fault detector 206, this condition results in a change in the current $I_A$ or in the voltage difference from ground. The controller 204 includes logic (implemented in hardware or a combination of hardware and software/firmware) that interprets this change as a ground fault and correlates the ground fault with the input change status of the affected I/O signal. When a ground fault is detected, the ground fault detector 206 can be isolated from ground so it will not influence the affected I/O signal anymore.

In the event of a ground fault, the controller 204 can quickly determine the status of the ground fault detector 206 in order to detect a signal status change caused by the ground fault. This allows the controller 204 to quickly take action on the signal status change. In some embodiments, the controller 204 can disconnect the ground fault detector 206 from ground so the I/O signals at the controller 204 are no longer influenced by the voltage or current changes caused by the ground fault detector 206. The ground fault detector 206 can then be periodically re-activated to detect whether the ground fault is still present. These features and operations are described in greater detail below.

Although FIG. 2 illustrates example portions of one industrial process control and automation system 200 that includes a ground fault detector 206, various changes may be made to FIG. 2. For example, an industrial process control and automation system could include any number of controlled devices, controllers, and ground fault detectors. Also, the makeup and arrangement of the system 200 is for illustration only. Components could be added, omitted, combined, or placed in any other configuration according to particular needs. In addition, FIG. 2 illustrates one example operational environment where a ground fault detector could be used. One or more ground fault detectors could be used in any other suitable systems.

Figure 3:
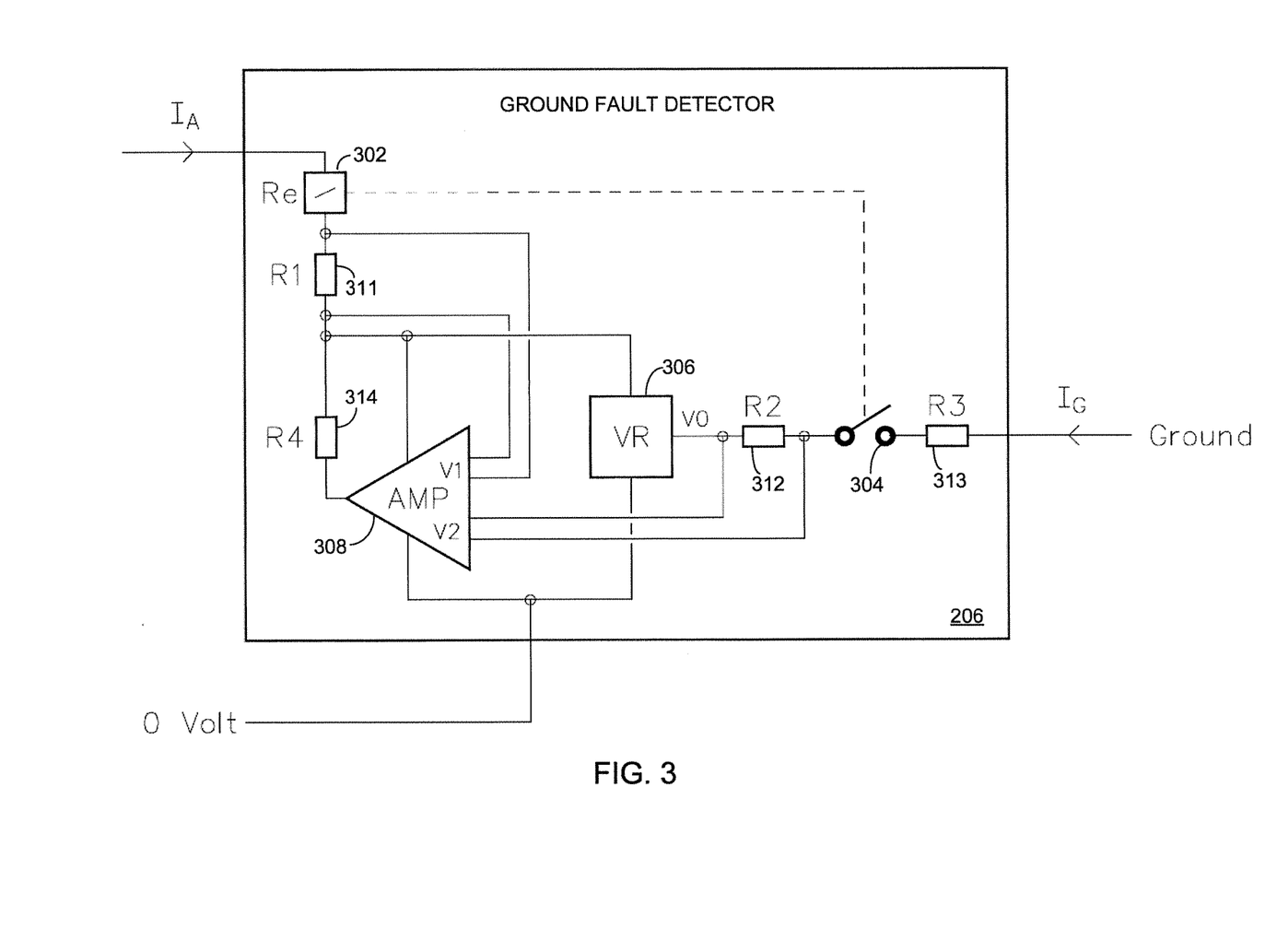
FIG. 3 illustrates a more detailed view of an example ground fault detector according to this disclosure.

FIG. 3 illustrates a more detailed view of an example ground fault detector 206 according to this disclosure. As shown in FIG. 3, the ground fault detector 206 includes a relay 302, a relay contact 304, a voltage regulator 306, an amplifier 308, and resistors 311-314.

When an analog input 210 connecting the ground fault detector 206 to the controller 204 is activated (a voltage of 0V is generated on the input pin of the analog input 210), current $I_A$ flows through the relay 302 and into other portions of the ground fault detector 206. The relay 302 controls operation of the relay contact 304. The relay 302 could be implemented in any suitable manner, such as with a Photo-MOS or any other equivalent component. When the current $I_A$ flows through the relay 302, the relay 302 closes the relay contact 304, thereby connecting the resistor 313 and ground to the rest of the ground fault detector 206.

The voltage regulator 306 creates a voltage potential V0 in relation to the "0 volt" level of the controller 204. Consequently, the "0 volt" level of the controller 204 has the same voltage potential V0 relative to ground. V0 is the voltage potential that exists whenever the relay contact 304 is closed and there is no ground fault (and thus no ground current $I_G$). In some embodiments, the voltage V0 is approximately 4 VDC, although it could be higher or lower or negative. The voltage potential V0 is connected to ground through the resistors 312-313. In the event that a ground fault occurs, the resistors 312-313 limit the ground fault current $I_G$ drawn by the ground fault detector 206 and scale the external ground voltage to a range that can be handled by the ground fault detector 206.

The amplifier 308 controls the current through the resistor 314 and thus determines the voltage drop V1 over the resistor 311. When no ground fault occurs, the current through the resistor 312 is zero, and the voltage drop V2 is also zero. When a ground fault occurs, current flows through the resistor 312, and the voltage drop V2 becomes non-zero as described in greater detail below. Based on changes in the voltages V1 and V2, the amplifier 308 can change its output voltage. The changed output voltage affects the current drawn through the resistor 314. The level of current flowing through the resistor 314 also affects the level of current flowing through the resistor 311, which is $I_A$. This, in turn, affects the voltage drop V1 over the resistor 311.

When no ground fault occurs, the ground fault detector 206 operates at a steady state, and the current $I_A$ is at a substantially constant level. In such a steady state, the current $I_A$ can be referred to as $I_0$. In the event of a ground fault, the current $I_G$ begins to flow, and the steady state of the ground fault detector 206 is disturbed.

The voltage drop between ground and V0 and the total resistance of the resistors 312-313 determine the amount of the current $I_G$. The direction of the current $I_G$ is determined by the voltage of the ground fault. If the ground fault occurs at a location in the system 200 with a voltage higher than V0, the current $I_G$ flows in the direction from ground to the resistor 313, so the current $I_G$ flows into the ground fault detector 206. Alternatively, if the fault occurs in a wire with a voltage below V0, the current $I_G$ flows from the resistor 313 to ground, so the current $I_G$ flows out of the ground fault detector 206.

The ground current $I_G$ causes a voltage drop V2 across the resistor 312. The amplifier 308 receives as an input the changed voltage V2. The amplifier 308 also receives as an input the voltage drop V1 across the resistor 311. If the current through the resistor 312 changes (such as if the ground current $I_G$ through the resistor 312 changes from zero to non-zero), the amplifier 308 operates to change the current $I_A$ through the resistor 311, as well. Specifically, when the ground current $I_G$ flows into the ground fault detector 206, the voltage V2 becomes positive, and the amplifier 308 lowers its own output voltage, increasing the current flow through the resistor 314 into the amplifier 308. This also increases the current flow $I_A$ through the resistor 311 since the resistors 311 and 314 are connected in series. Alternatively, when the ground current $I_G$ flows out of the ground fault detector 206, the voltage V2 becomes negative, and the amplifier 308 raises its own output voltage, decreasing the current flow through the resistor 314 into the amplifier 308. This also decreases the current flow $I_A$ through the resistor 311.

Thus, the existence of the ground current $I_G$ causes a change in the input current $I_A$ drawn by the ground fault detector 206. The controller 204 can interpret the change in current to determine if there is a ground fault. In some embodiments, the controller 204 can calculate the ground voltage by reading the current $I_A$ drawn by the ground fault detector 206.

In particular embodiments, the controller 204 applies an equation to evaluate the change in current, if any. The equation can be given by:

$$I_A = I_0 + B \times I_G,$$

where $I_A$ is the current drawn by the ground fault detector 206 at a given moment, $I_0$ is the current that is drawn by the ground fault detector 206 when no ground fault is detected (at steady state), $I_G$ is the ground current, and B is a constant. If a ground fault is detected, $I_G$ is non-zero, and the current $I_A$ is not equal to $I_0$. The value of B is a constant that is used as a scaling factor so that $I_A$ is in the normal operating range of the analog input 210. That is, the value B is used to scale the range of the ground current $I_G$ to approximately the range of the current $I_A$. The value of B can be determined empirically and can be selected based on the range of possible values of $I_A$ at run time. For example, B might have a first value if $I_A$ is likely to be in a range of 0-50 mA, a second value if $I_A$ is likely to be in a range of 0-20 mA, and so on.

If the controller 204 detects a ground fault, the controller 204 can decide to switch off the current leakage detected at the ground fault detector 206 by isolating the ground fault detector 206 from ground. In the switched off state, the ground fault detector 206 no longer influences the signal associated with the ground fault. To disconnect the ground fault detector 206 from ground, the controller 204 switches off the current $I_A$, which opens the relay 302. However, the controller 204 does not have to disconnect the ground fault detector 206 from ground. There may be situations where a certain amount of ground current is acceptable, and the ground fault detector 206 may not be turned off. The controller 204 can make that determination based on preprogramming.

Although FIG. 3 illustrates a more detailed view of one example ground fault detector 206, various changes may be made to FIG. 3. For example, while FIG. 3 illustrates one example circuit implementation of the ground fault detector 206, other circuitry configured to perform the same or similar functions could be used.

Figure 4:
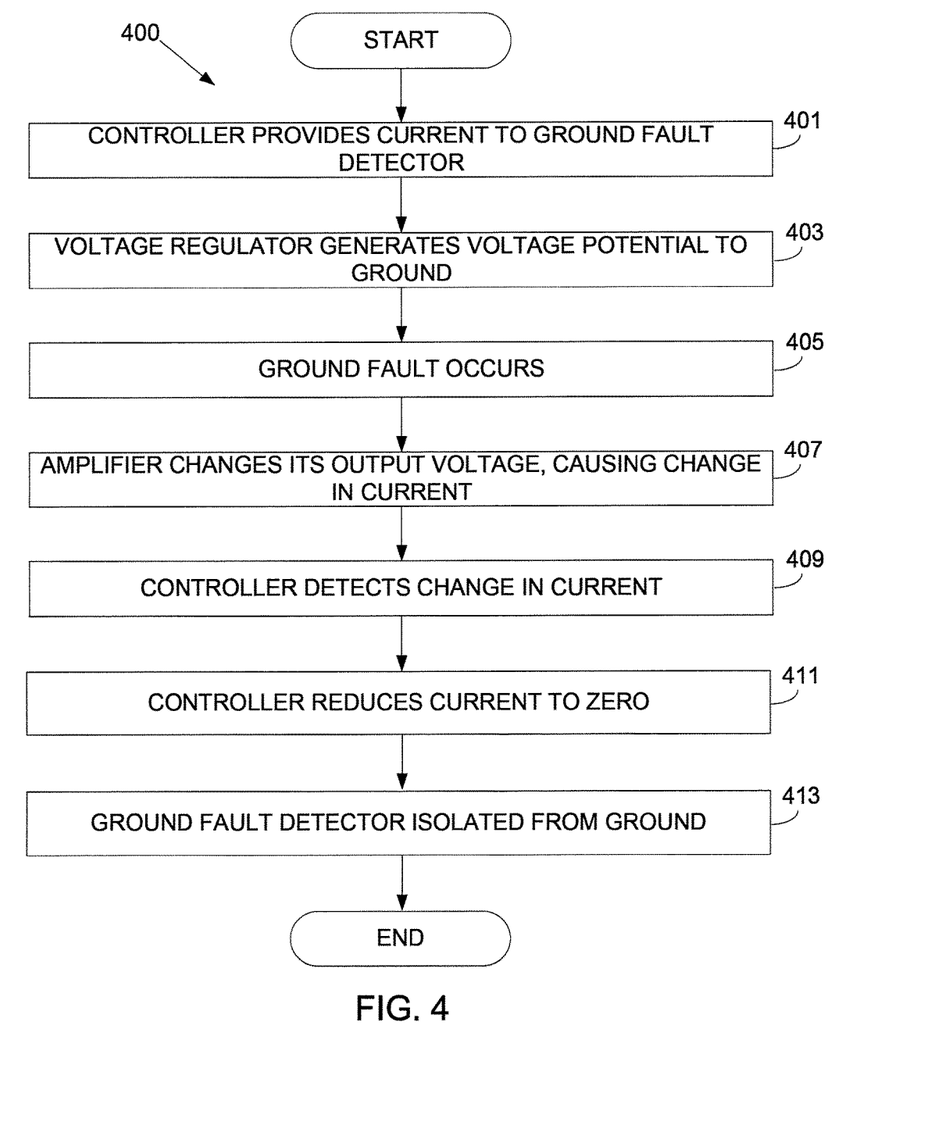
FIG. 4 illustrates an example method for ground fault detection according to this disclosure.

FIG. 4 illustrates an example method 400 for ground fault detection according to this disclosure. For ease of explanation, the method 400 is described as being performed by the system 200 of FIG. 2. However, the method 400 could be used with any suitable device or system.

At step 401, a controller of a control system (or other source) provides a current to a ground fault detector. This may include, for example, the controller 204 providing a first current $I_A$ to the ground fault detector 206. The current $I_A$ causes a relay (such as a relay 302) to close a relay contact (such as a relay contact 304) in the ground fault detector. At step 403, the ground fault detector provides a voltage potential to ground. This may include, for example, the voltage regulator 306 generating a voltage potential V0 to ground.

At step 405, a ground fault occurs, causing a ground current to flow into or out of the ground fault detector. This may include, for example, the ground current $I_G$ flowing into or out of the ground fault detector 206. In response to the ground current flowing into or out of the ground fault detector, at step 407, an amplifier in the ground fault detector changes its output voltage. This may include, for example, the amplifier 308 changing its output voltage. In some embodiments, the ground current flows through a first resistor (such as a resistor 312) and causes a voltage drop across the first resistor. This voltage drop is received as an input at the amplifier, causing the amplifier to change its output voltage.

The change in the output voltage of the amplifier causes a change in the current (such as the current $I_A$) drawn by the ground fault detector. More particularly, the change in the output voltage of the amplifier results in a change in a second current across a second resistor (such as a resistor 314), thereby causing the change in the current across a third resistor (such as the resistor 311) in series with the second resistor.

At step 409, the controller detects the change in the current and interprets the change as an indication of the ground fault. In response, at step 411, the controller reduces the current to the ground fault detector to zero. Without current, the relay opens the relay contact, and the open relay contact isolates the ground fault detector from ground (step 413).

Although FIG. 4 illustrates one example of a method 400 for ground fault detection, various changes may be made to FIG. 4. For example, while shown as a series of steps, various steps shown in FIG. 4 could overlap, occur in parallel, occur in a different order, or occur multiple times. Moreover, some steps could be combined or removed and additional steps could be added according to particular needs.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims is intended to invoke 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A ground fault detector comprising:
   a relay configured to receive a first current from a controller of an industrial process control and automation system, the controller configured to control the ground fault detector and a plurality of field devices connected in parallel with the ground fault detector, the ground fault detector and the field devices each configured to operate on an independent channel of the controller;
   a voltage regulator configured to provide a voltage potential to ground;
   a first resistor coupled between the voltage regulator and ground;
   a second resistor; and
   an amplifier configured to:
   receive, as an input, a change in a voltage drop across the first resistor due to a ground current flowing through the first resistor and into or out of the ground fault detector;
   receive as an input, a change in voltage drop across the second resistor coupled between the relay and the amplifier; and
   in response to the received change in the voltage drop across the first resistor, a change in the output voltage of the amplifier occurs, wherein the change in the output voltage of the amplifier changes the current flowing through the second resistor resulting in a change in the first current received at the relay, the change in the first current indicative of a ground fault.

2. The ground fault detector of claim 1, further comprising:
   a second resistor; and
   a third resistor connected in series between the second resistor and the relay,
   wherein the ground fault detector is configured such that the change in the output voltage of the amplifier results in a change in a second current across the second resistor and thereby causes the change in the first current across the third resistor.

3. The ground fault detector of claim 2, wherein, in response to the first current being reduced to zero, the relay is configured to open a relay contact of the ground fault detector to isolate the ground fault detector from ground.

4. The ground fault detector of claim 1, wherein a magnitude of the ground current is based on the voltage potential to ground.

5. The ground fault detector of claim 1, wherein a direction of the ground current into or out of the ground fault detector is based on a location of the ground fault.

6. The ground fault detector of claim 3, further comprising:
   a fourth resistor connected in series with the first resistor and the relay contact.

7. The ground fault detector of claim 1, wherein the ground fault detector is electrically connected to ground and the plurality of field devices are electrically isolated from ground.

8. A method comprising:
   receiving, a first current at a relay of a ground fault detector, a first current from a controller of an industrial process control and automation system, the controller configured to control the ground fault detector and a plurality of field devices connected in parallel with the ground fault detector, the ground fault detector and the field devices each configured to operate on an independent channel of the controller;
   providing, by a voltage regulator of the ground fault detector, a voltage potential to ground, wherein, a first resistor is coupled between the voltage regulator and ground;

receiving, at an amplifier of the ground fault detector, a change in a voltage drop across the first resistor due to a ground current flowing through the first resistor and into or out of the ground fault detector;

receiving as an input at an amplifier, a change in voltage drop across a second resistor coupled between the relay and the amplifier; and in response to the received change in the voltage drop across the first resistor, a change in the output voltage of the amplifier occurs, wherein the change in the output voltage of the amplifier changes the current flowing through the second resistor resulting in a change in the first current received at the relay, the change in the first current indicative of a ground fault.

9. The method of claim 8, wherein the change in the output voltage of the amplifier results in a change in a second current across a second resistor, thereby causing the change in the first current across a third resistor in series between the second resistor and the relay.

10. The method of claim 9, further comprising:
in response to the first current being reduced to zero, opening, by the relay, a relay contact of the ground fault detector, the open relay contact isolating the ground fault detector from ground.

11. The method of claim 8, wherein a magnitude of the ground current is based on the voltage potential to ground.

12. The method of claim 8, wherein a direction of the ground current into or out of the ground fault detector is based on a location of the ground fault.

13. The method of claim 10, wherein the ground fault detector further comprises a fourth resistor connected in series with the first resistor and the relay contact.

14. The method of claim 8, wherein the ground fault detector is electrically connected to ground and the plurality of field devices are electrically isolated from ground.

15. A system comprising:
a controller configured to control a plurality of field devices of an industrial process control and automation system; and
a ground fault detector electrically coupled to the controller and plurality of field devices, the ground fault detector and the field devices each configured to operate on an independent channel of the controller, the ground fault detector comprising:
a relay configured to receive a first current from the controller;
a voltage regulator configured to provide a voltage potential to ground;
a first resistor coupled between the voltage regulator and ground;
a second resistor; and
an amplifier configured to:
receive, as an input, a change in a voltage drop across the first resistor due to a ground current flowing through the first resistor and into or out of the ground fault detector;
receive as an input, a change in voltage drop across the second resistor coupled between the relay and the amplifier; and
in response to the received change in the voltage drop across the first resistor, a change in the output voltage of the amplifier occurs, wherein the change in the output voltage of the amplifier changes the current flowing through the second resistor resulting in a change in the first current received at the relay;
wherein the controller is configured to detect the change in the first current as an indication of a ground fault.

16. The system of claim 15, wherein the ground fault detector is configured such that the change in the output voltage of the amplifier results in a change in a second current across a second resistor and thereby causes the change in the first current across a third resistor in series between the second resistor and the relay.

17. The system of claim 16, wherein:
the controller is configured, in response to detecting the change in the first current, to reduce the first current to zero; and
the relay is configured, in response to the first current being reduced to zero, to open a relay contact of the ground fault detector, the open relay contact isolating the ground fault detector from ground.

18. The system of claim 15, wherein a magnitude of the ground current is based on the voltage potential to ground.

19. The system of claim 15, wherein a direction of the ground current into or out of the ground fault detector is based on a location of the ground fault.

20. The system of claim 15, wherein the ground fault detector is electrically connected to ground and the plurality of field devices are electrically isolated from ground.

* * * * *